United States Patent [19]

Harigane et al.

[11] 4,320,574
[45] Mar. 23, 1982

[54] INSERTING ASSEMBLY FOR AUTOMATICALLY INSERTING PARALLEL LEAD ELECTRONIC COMPONENT INTO OPENINGS IN A PRINTED CIRCUIT BOARD

[75] Inventors: Kotaro Harigane; Tetsuro Ito, both of Tokyo, Japan

[73] Assignees: Tokyo Denki Kagaku; Kogyo Kabushiki Kaisha, both of Japan

[21] Appl. No.: 122,864

[22] Filed: Feb. 20, 1980

[30] Foreign Application Priority Data

Feb. 21, 1979 [JP] Japan ................................. 54-19488

[51] Int. Cl.³ ............................................. H05K 3/30
[52] U.S. Cl. ................................... 29/741; 29/564.6; 29/834; 29/840
[58] Field of Search ................. 29/741, 740, 739, 759, 29/834, 840, 564.1, 564.6

[56] References Cited
U.S. PATENT DOCUMENTS 4,054,988 10/1977 Masuzima et al. .................. 29/564.6
4,196,513 4/1980 Harigane et al. ..................... 29/741

Primary Examiner—Carl E. Hall
Attorney, Agent, or Firm—Steinberg & Raskin

[57] ABSTRACT

Apparatus for automatically inserting parallel leads of electronic components into openings in a printed circuit board having an improved lead holding and guiding assembly. The improved lead holding and guiding assembly is associated with the frame of the apparatus and includes a guiding member mounted for rotation about an axis of rotation which extends in the x-direction, i.e., in the direction of a line which is orthogonal to both of the parallel leads, and for longitudinal movement in the z-direction, i.e., in the direction which is perpendicular to the orthogonal plane which contains the orthogonally extending line. The holding and guiding assembly further includes a pair of holding members disposed at respective sides of the guiding members such that the side surfaces of the end portion of the guiding member and the respective inner side surfaces of the holding members constitute lead holding and guiding portions. The holding members are mounted for rotation relative to the guiding member about respective axes of rotation so that the lead holding and guiding portions can be opened and closed as the holding members are rotated.

3 Claims, 19 Drawing Figures

INSERTING ASSEMBLY FOR AUTOMATICALLY INSERTING PARALLEL LEAD ELECTRONIC COMPONENT INTO OPENINGS IN A PRINTED CIRCUIT BOARD

BACKGROUND OF THE INVENTION

This invention relates generally to apparatus for securing parallel leads of electronic components to a printed circuit board and, in particular, to apparatus for automatically inserting parallel lead electronic components into lead receiving openings in a printed circuit board having improved lead holding and guiding apparatus.

It is known to utilize an electronic component web carrier 3 as shown in FIG. 1 in inserting electronic components in a printed circuit board. More specifically, the electronic component web carrier 3 has a supporting strip 65 on which a multiplicity of electronic components 17 are supported by means of an adhesive tape 66, each of the components having an electronic element 64 such as a capacitor, resistor or the like and parallel leads 53. The electronic components 17 are disposed in parallel relation and at a constant pitch. The supporting strip 65 is provided with openings or perforations 32 for locating and feeding the electronic component web carrier 3.

This electronic component web carrier 3 is typically placed in an automatic inserting machine. The final step of the operation of the automatic inserting machine is accomplished in the inserting assembly of the machine. Thus, each electronic component 17, which has been separated in a manner shown in FIG. 2, is held by a lead holding and guiding assembly. After insertion of the leads 53 into the printed circuit board 19 as shown in FIG. 3, the projecting ends of the leads 53 are cut and bent to fix the electronic component 17 as shown in FIG. 4. A reference numeral 265 denotes a stopper which limits the insertion depth.

In loading a printed circuit board or the like with a multiplicity of electronic components, it is highly desirable to reduce as much as possible the distance between adjacent electronic components, in order to reduce the size of the finished product. In the conventional apparatus, however, the distance between adjacent electronic components, is necessarily large so as to avoid the interference between the lead holding and guiding assembly and adjacent electronic components already inserted during insertion of a new electronic component, and in order to avoid any interference between the lead holding and guiding assembly and the newly inserted electronic components, as well as the electronic components which had been previously inserted during the lifting of the lead holding and guiding assembly subsequent by the insertion of the new electronic component. These constraints arise from the fact that the lead holding and guiding assembly is relatively large and has a large stroke or range of movement, which combine to limit the reduction of size of the product.

In addition, the lead holding and guiding assembly has a complicated construction, the conventional assembly having two pairs of holding members.

SUMMARY OF THE INVENTION

Accordingly, one object of the present invention is to overcome the above-described problem of the prior art, by providing an inserting apparatus for electronic components in which the construction of the lead holding and guiding assembly is reduced and the size and range of movement of the same are reduced so as to avoid any interference between the lead holding and guiding assembly and the electronic components during insertion and withdrawal of the same, thereby to permit the mounting of electronic components at a higher density than has been possible heretofore.

To this end, according to the invention, there is provided an inserting apparatus having a lead holding and guiding assembly including a guide member and a pair of holding members disposed at both sides of the guide member. The holding members are rotatable relative to the guide member around axes parallel to a line in a y-z plane so as to be opened and closed.

In the instant application, reference is made to x, y- and z-directions with respect to an electronic component. These directions are defined as follows:

x-direction:

In a plane orthogonally intersecting the two parallel leads of the electronic component, the direction of a line formed by connecting the two intersecting points of said plane and the two parallel leads.

y-direction:

In the above-mentioned plane, a direction perpendicular to the x-direction.

z-direction:

A direction perpendicular to the above-mentioned plane, namely a direction parallel to the above-mentioned leads of the electronic component.

More specifically, the invention provides an inserting apparatus whereby parallel lead electronic components are automatically inserted into openings in a printed circuit board. The apparatus comprises a frame and a lead holding and guiding assembly mounted for movement in z-direction with respect to the frame, the lead holding and guiding assembly having a guiding member mounted for rotation around an axis extending in x-direction and for movement in z direction and two holding members disposed at respective sides of the guiding member, the side surfaces of the end portion of the guiding member and the inner surface of the holding members cooperating to constitute a lead holding and guiding portion for holding leads of the electronic components. The holding members are mounted for rotation around respective axes which are parallel to a line in the Y-Z plane relative to the guiding member, so that the lead holding and guiding portion is opened and closed by the rotation of the holding members.

DESCRIPTION OF THE DRAWINGS

For a more complete understanding of the invention, reference is had to the following description taken in connection with the accompanying drawings, in which:

FIGS. 5 to 9 illustrate one embodiment of the invention in which:

FIG. 5 is a front elevational view of an inserting apparatus constructed according to the present invention;

FIG. 6 is a bottom plan view of the inserting apparatus with the lead holding and guiding assembly removed for clarity;

FIG. 7 is a side elevational view of the inserting apparatus illustrated in FIG. 5;

FIG. 8 is a sectional view of the inserting apparatus illustrating a portion thereof around a sleeve;

FIG. 9 is a bottom plan view of a lower slider assembly;

DESCRIPTION OF THE PREFERRED EMBODIMENTS

Figure 5:
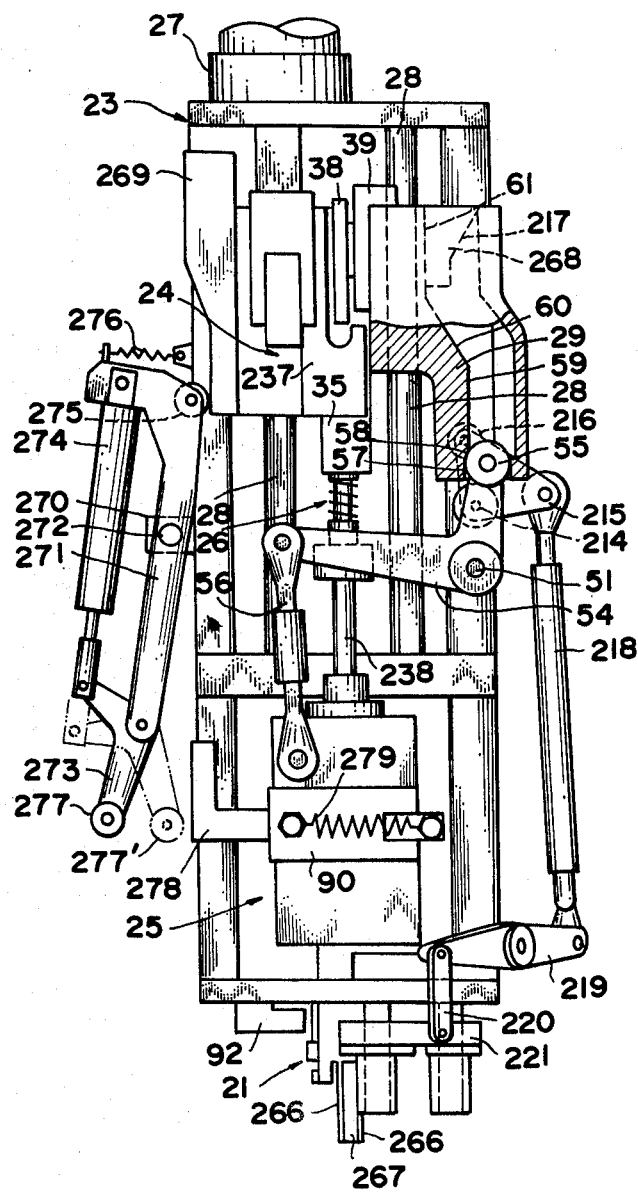
Figure 6:
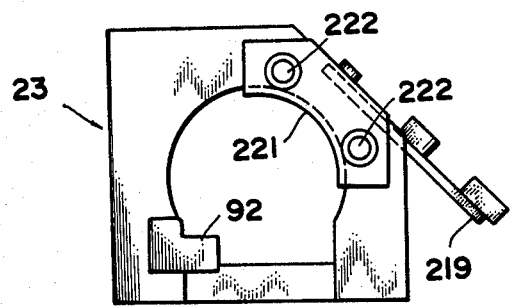
Figure 7:
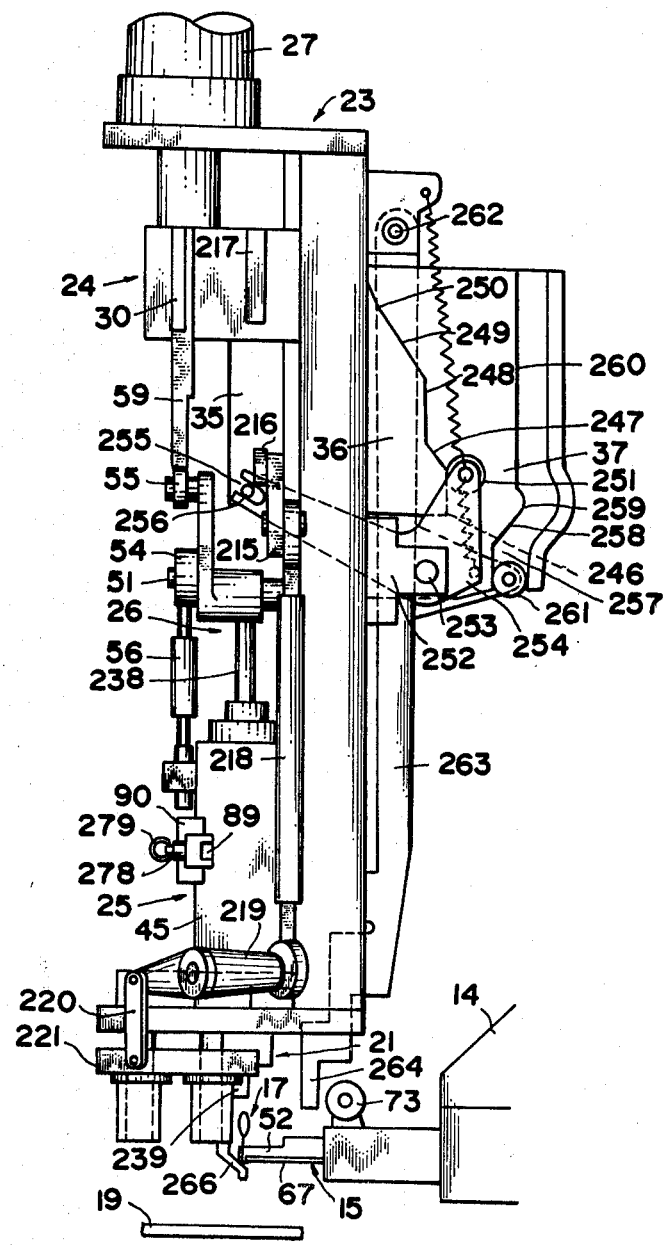

Referring now to FIGS. 5-7, one embodiment of the inserting apparatus constructed and arranged in accordance with the invention is shown. Inserting apparatus comprises frame 23 attached to a machine body and includes an upper slider sub-assembly 24 and a lower slider sub-assembly 25 each supported independently and mounted slideably on frame 23, a lead holding and guiding sub-assembly 21 supported on lower slider sub-assembly 25 mounted rotatably about a vertical shaft thereof, and a push bar sub-assembly 26 supported by upper slider sub-assembly 24 and lead holding and guiding sub-assembly 21. Each sub-assembly of the improved insert assembly will be discussed in detail below.

Figure 8:
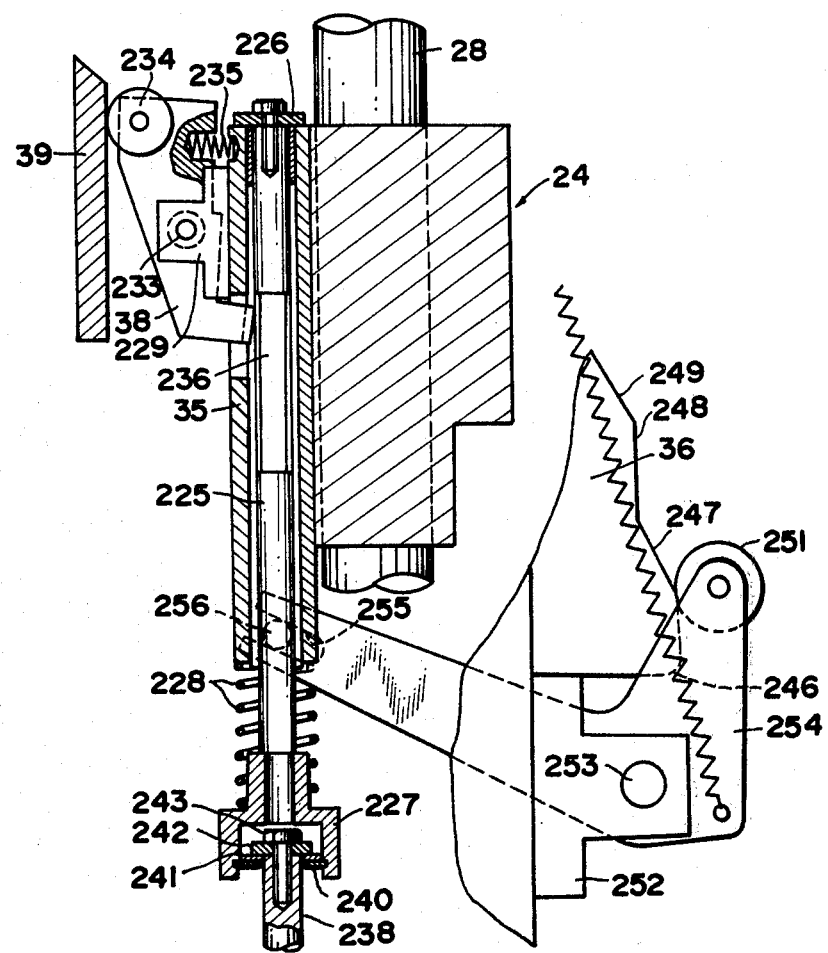

Upper slider sub-assembly 24 is supported slideably along a vertical guide rod 28 mounted on frame 23. A cylinder 27 actuated by the NC program causes upper slider sub-assembly 24 to move vertically along guide rod 28. Several cam members are supported on upper slider sub-assembly 24 as follows. Lower slider cam 29 is adapted to determine movement of lower slider sub-assembly 25. An opening and closing cam 268 is adapted to move vertically and to open and close outer holding members 266, 266 and inner guiding member 267 of lead holding and guiding sub-assembly 21. A sleeve cam 36 is adapted to regulate movement of a sleeve 35 which forms a part of push bar sub-assembly 26. A chuck cam 37 is adapted to open and close chucks 15. A cam clamp 39 is adapted to regulate movement of a clamp 38 for clamping push bar sub-assembly 236 as shown in FIG. 8. In addition, a lead holding and guiding sub-assembly rotating cam 269 adapted to rotate lead holding and guiding sub-assembly 21 is mounted.

Figure 9:
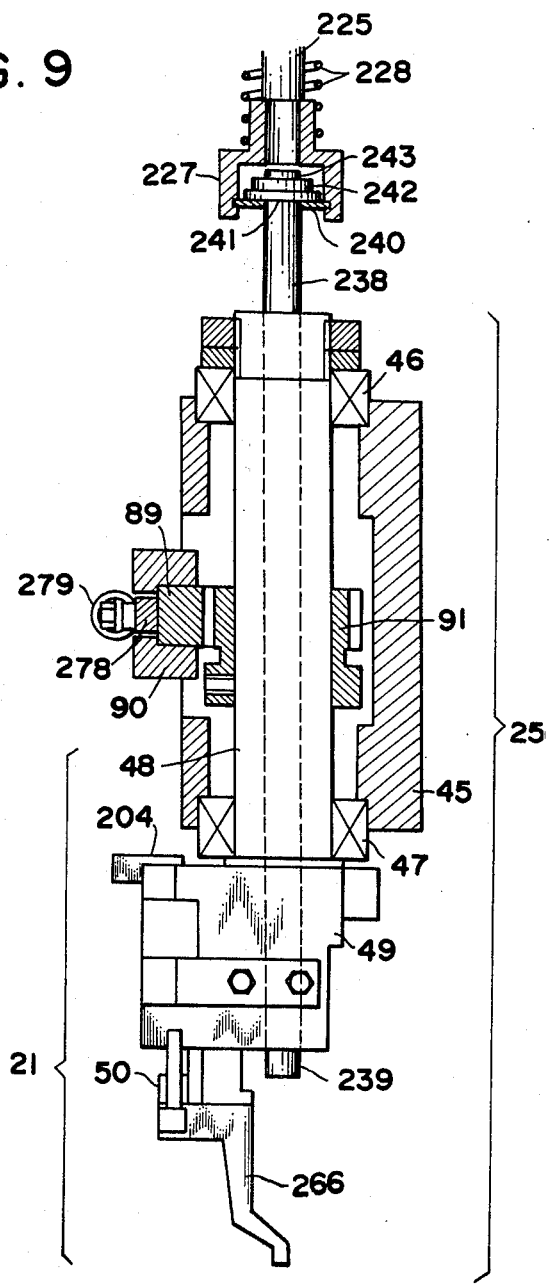

Lower slider sub-assembly 25 is supported by and pivots on frame 23 so that a body 45, shown in FIGS. 5, 7 and 9, slides in the vertical direction with respect to frame 23. As shown in FIG. 9, lead holding and guiding sub-assembly 21 is supported rotatably in body 45 at the position of a rotary sleeve 48 by bearings 46 and 47. A block 49 provided on lead holding and guiding sub-assembly 21 is mounted on the lower end of rotary sleeve 48 for anchoring outer holding members 266, 266 and inner guiding member 267 for holding electronic component 17 by leads 53. An operation rod 50 for actuating movement of outer holding members 266, 266 and inner guiding member 267 is mounted slideably on block 49 so as to move in the vertical direction.

Referring now to FIG. 5, lower slider sub-assembly 25 is displaced in the vertical direction by a roller 55 mounted rotatably on the upper end of a bell crank 54 pivotally attached to frame 23 by a pin 51. The lower end of bell crank 54 is attached pivotally to lower slider sub-assembly 25 by a connecting rod 56. Lower slider cam 29 is moved in the vertical direction by movement of upper slider sub-assembly 24 so that roller 55 engages lower slider cam 29 displacing bell crank 54 in the clockwise direction and lower slider sub-assembly 25 is raised by action of connecting rod 56.

Cam 29 is formed with a short vertical surface 57, an inclined convex surface 58, a long vertical surface 59 extending vertically, a gradually concaved inclined face 60 and upper vertical surface 61, respectively, extending upwardly from the lower end of cam 29. Accordingly, when roller 55 travels along inclined surface 60 towards the center of frame 23, lower slider sub-assembly 25 is lowered. Body 45 of lower slider sub-assembly 25 impinges on a stopper 92 mounted on the lower end of frame 23 prior to roller 55 falling in contact with flat portion 61. Lower slider cam 29 is a positive motion cam having a groove which regulates each side of roller 55. Lower slider cam 29 is mounted on upper slider sub-assembly 24 and functions to prevent lower slider sub-assembly 25 from springing up by a repulsive force when it impinges on stopper 92.

Referring now to the mechanism for rotating the rotary sleeve 48, a direction switching member 271 (FIG. 5) is pivotally attached by means of a pin 272 to a bracket 270 which in turn is attached to the frame 23. An operation lever 273 and a cylinder 274 are pivotally secured to the direction switching lever 271. The operation lever 273 and the cylinder 274 are pivoted to each other. The direction switching lever 271 is also provided with a roller 275 which is normally pressed against a rotary cam 269 by means of a spring 276. The operation lever 273 carries at its other end a roller 277 which can be moved to a position, denoted 277', as the cylinder 274 is extended.

Reference numeral 278 denotes a slider which is guided for horizontal sliding movement, and is always biased to the left by means of the spring 279 as shown in FIG. 5.

As shown in FIG. 9, the slider 278 is attached to the rack 89 which in turn is mounted for horizontal sliding movement by a guide 90 mounted on the body 45. The rack is adapted to mesh with a pinion 91 to rotate the latter, thereby to rotate the sleeve 48.

Figure 15:
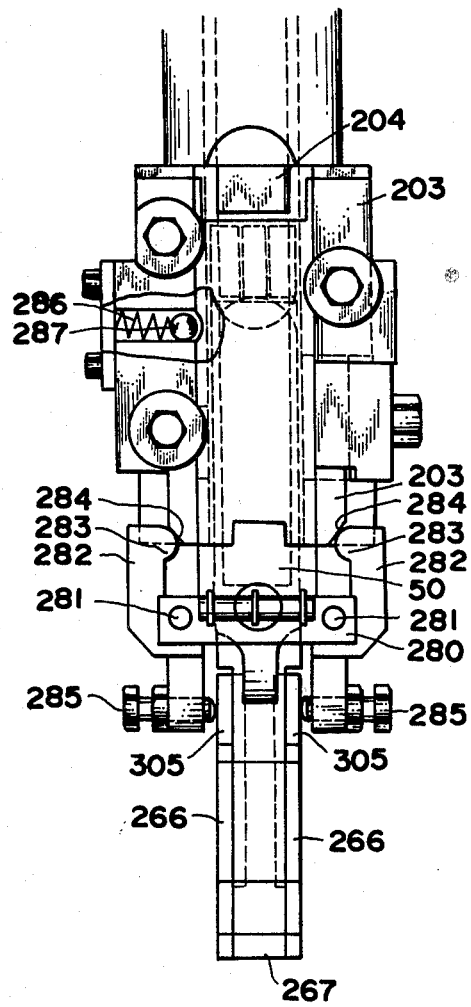
FIG. 15 is a front elevational view of the lead holding and guiding assembly illustrated in FIG. 10.

An explanation will be made hereinafter as to the holding function of the lead holding and guiding sub-assembly 21. As shown in FIGS. 10 to 16, an operation rod 50 is slideably disposed between the block 49 and a cover 203 which is attached to the latter, so that the operation rod is free for up and down sliding movement. An L-shaped lever 204 is formed on the top of the operating rod 50, whereas a T-shaped portion 280 is formed on the lower end of the same as shown in FIG. 15. Cam levers 282 (FIG. 15) are pivoted to both ends of the T-shaped portion 208 by means of pins 281. Each cam lever 282 is provided with a cam head 283 formed on one end thereof. The cam heads 283 are located in opposed relationship to respective cam surfaces 284 formed on the cover 203. Each cam lever 282 is provided at its other end with a pressing bolt 285 which acts as a striker. A spring 286 and a ball 287 in combination constitute a click stop mechanism for the operation rod 50.

Figure 12:
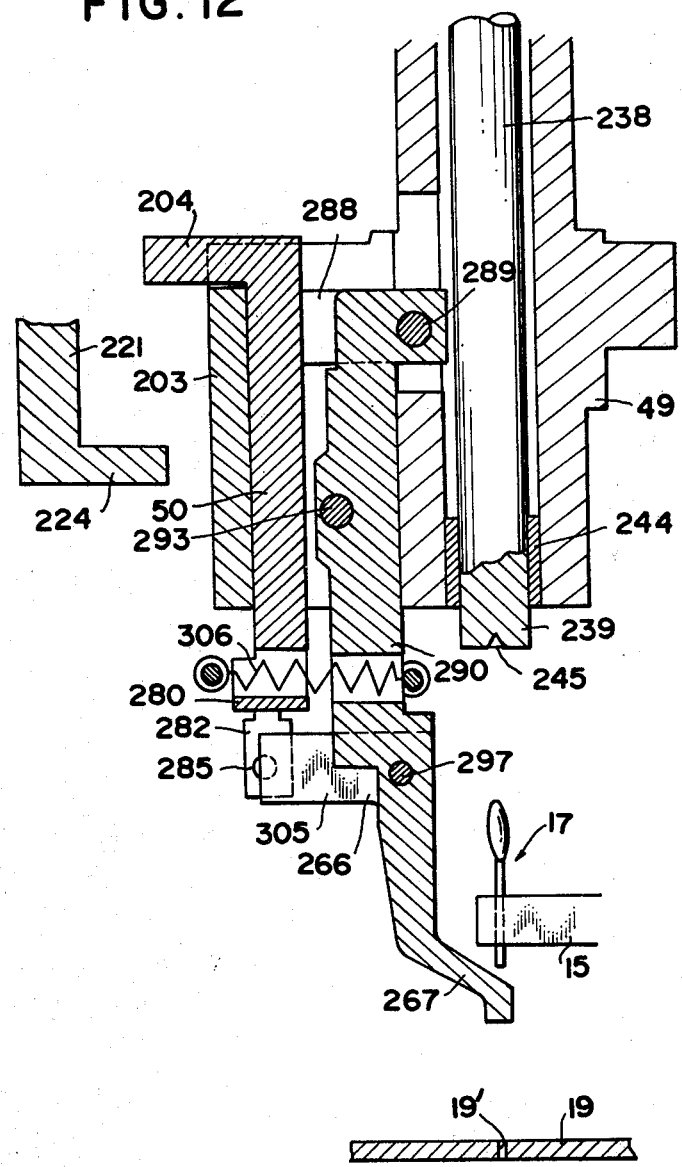
Figure 13:
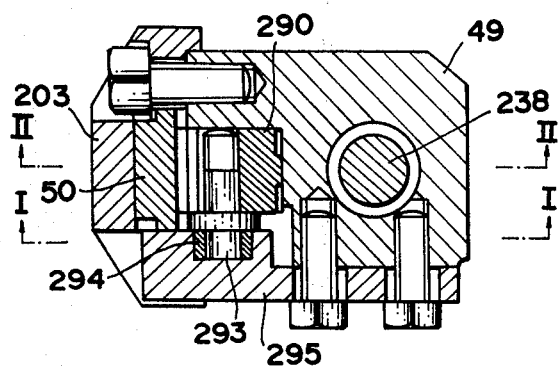
FIGS. 13 and 14 are sectional plan view taken along the lines III—III and IV—IV, respectively of FIG. 10.
Figure 14:
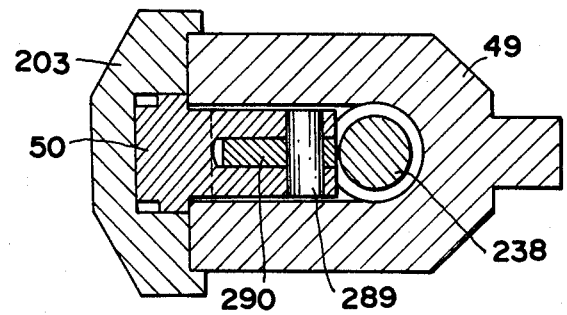
Figure 18:
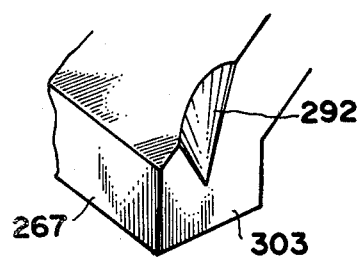

A main guide 290 is rotatably attached to a bracket 288 of the operation rod 50 by means of a pin 289 (FIG. 12). A guiding member 267 is formed at the lower end of the main guide 290. As will be seen from FIG. 18, a conical guide groove 292 for introducing lead 53 of the electronic component 17 is formed in each side surface of the guiding member 267.

A roller 294 (FIG. 11) is rotatably carried by an intermediate portion of the main guide 290 by means of a pin 293. The roller 294 is adapted to be guided by a cam groove 296 of a cam plate 295 which is fixed to the block 49. The cam groove 296 is a vertical groove having parallel lower portion and an outwardly curved upper portion.

Two holding members 266,266 are disposed at respective sides of the main guide 290. Each holding member is attached by means of a pin 297 and a spring 298 in such a manner as to clamp the guiding member 267 therebetween. The guiding member 267 has a pair of vertical grooves 299 which loosely receive a corresponding pair of vertical protrusions 300 of the holding member 266 in such a manner as to permit relative rotation about a Z-axis but restrain a relative rotation around the X-axis.

Figure 16:
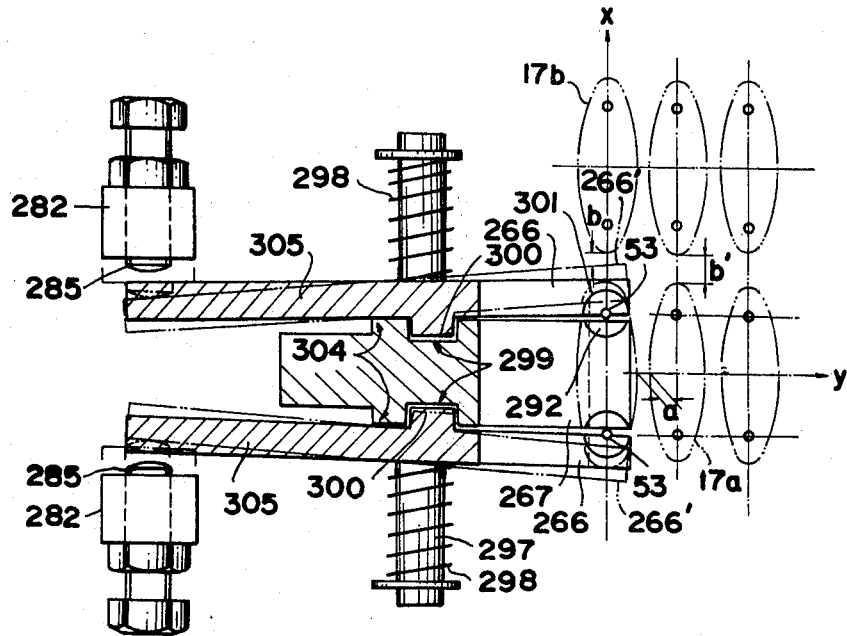
FIG. 16 is a sectional plan view taken along the line V—V of FIG. 10.
Figure 17:
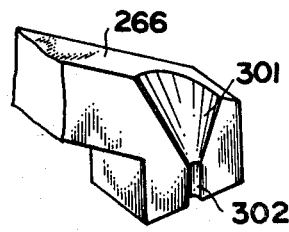
FIGS. 17 and 18 are perspective views illustrating the holding members.

As shown in FIG. 17, the inner side surface of end portions of the holding member 266 has a conical guide groove 301 and a holding groove 302. The holding groove 302 and a flat surface 303 of the guiding member 266 (FIG. 18) opposing the holding groove 303 in combination constitute a holding and guiding assembly for receiving the lead 53 in a manner shown in FIG. 16. The leads 53 are held by this holding and guiding assembly by the force of the springs 298 with corners 304 acting as a fulcrum.

The other ends of the holding members 266 are extended and have levers 305 which are in opposed relationship to the pressing bolts 285 of the cam levers 282.

The main guide 290 and the operating rod 50 are always biased toward each other by means of a spring 306 interposed therebetween.

It is understood that the groove 299, protrusion 300 and the corner 304 need not necessarily be vertical as illustrated in the drawings. For example, they may be inclined or horizontal, provided that they are parallel with a line in a Y-Z plane. More specifically, any construction which provides a fulcrum for opening the holding and guiding assembly when the lever is pressed by the lever 305 and which restricts the holding member 266 from rotating around X-axis with respect to the guiding member 267 can be used for this purpose.

Thus, the protrusions 300 may have a height greater than the depth of the grooves 299, so that the end of the protrusion 300 constitutes the fulcrum.

A smoother movement will be ensured if the end of the protrusion 300 and the groove 299 are provided with a circular cross-section.

Figure 10:
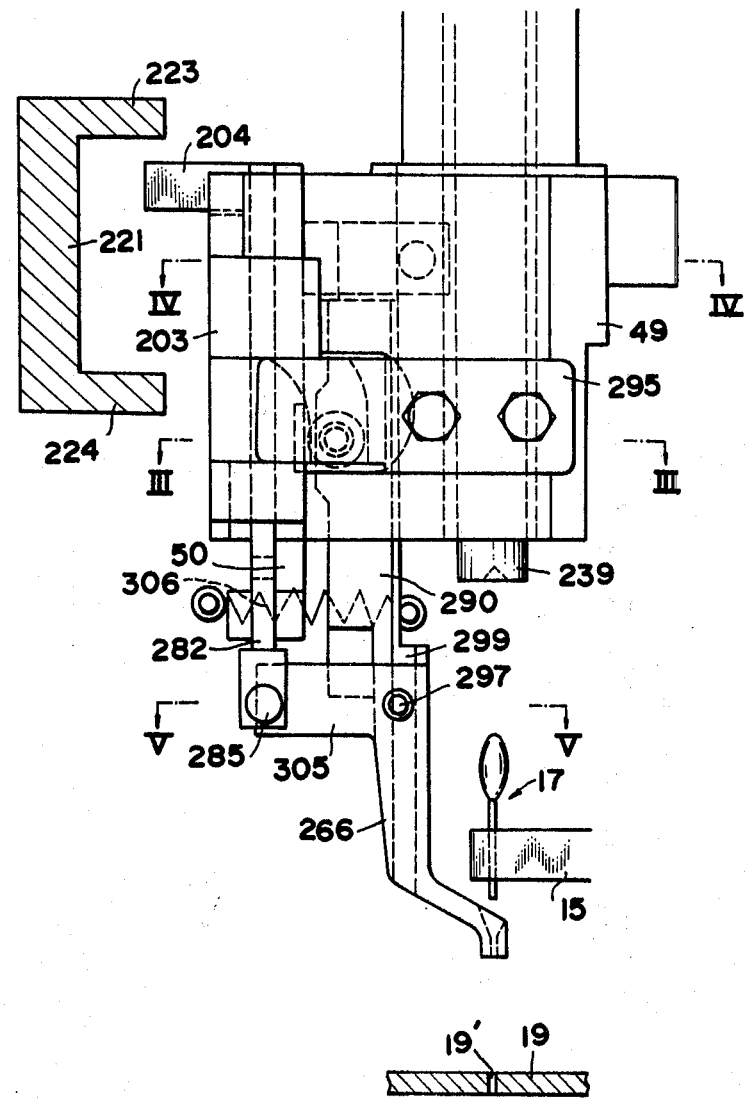
FIG. 10 is a side elevational view of a lead holding and guiding assembly according to the present invention.
Figure 11:
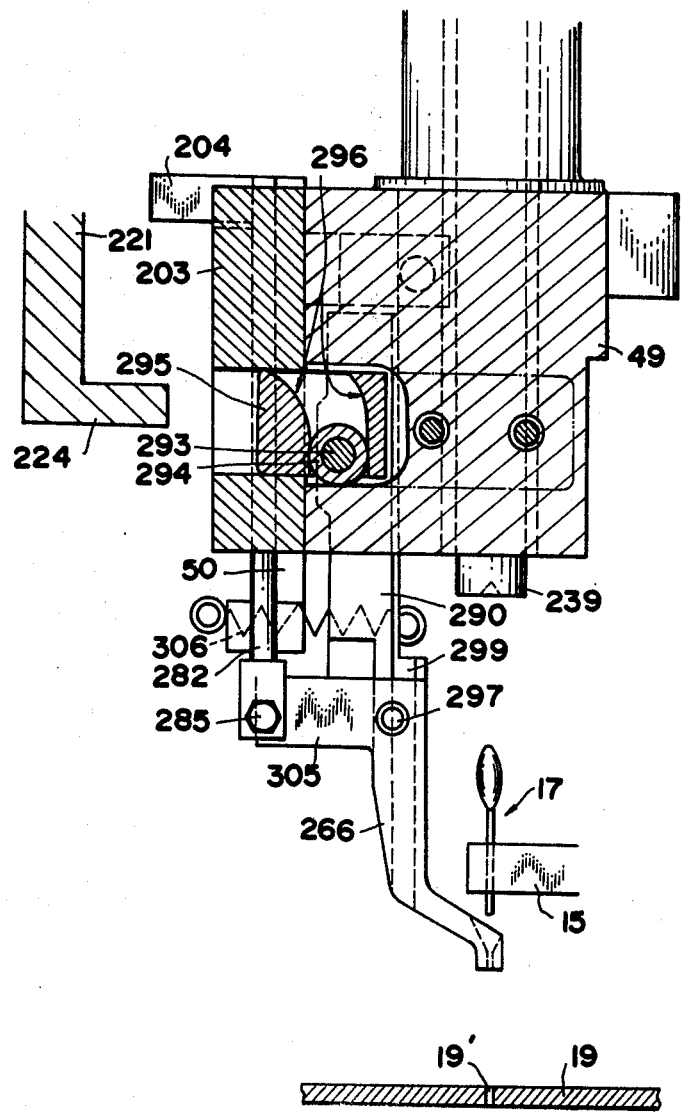
FIGS. 11 and 12 are sectional side elevational view taken along the lines I—I and II—II, respectively of FIG. 13.

Referring now to FIG. 5, the mechanism for opening and closing holding members 266, 266 will be described. Inner guiding member 267 and outer holding members 266, 266 are displaced by movement of upper slider sub-assembly 24 in the following manner. A roller 216 mounted rotatably on a link 215 is rotatably mounted to frame 23 by a pin 214. When upper slider sub-assembly 24 is lowered, an inclined face 217 of opening and closing cam 34 abuts roller 216 at the lowest point of the vertical movement of upper slider sub-assembly 24 and link 215 pivots in the clockwise direction about the axis of pin 214. A rod 218 rotatably connected to link 215 is pivotally connected to a lever 219 rotatably mounted to frame 23. The other end of lever 219 is linked pivotally to a striker 221 by a link 220. Striker 221 can slide vertically about a guide 222. Striker 221 includes an upper striker portion 223 and a lower striker portion 224, as shown in FIG. 10.

Push bar sub-assembly 26, shown in FIG. 8, includes an upper push bar sub-assembly and a lower push bar sub-assembly. The upper push bar sub-assembly includes sleeve 35 slideably supported on upper slider sub-assembly 24, an upper push bar 225 slideably mounted in sleeve 35 by means of a bearing, a stop plate 226 secured to the top of sleeve 35 and a coupling 227 mounted at the lower end of upper push bar 225. A spring 228 mounted about upper push bar 225 for providing a downward biasing force to coupling 227 is positioned between sleeve 35 and coupling 227. A clamp 38 pivotally secured by a pin 233 and a bearing 229 is attached to sleeve 35. Clamp 38 has a roller 234 rotatably mounted on its upper portion and a spring 235 positioned in a groove in clamp 38 and a groove formed in the upper portion of sleeve 35 for clamping and releasing a threaded portion 236 of upper push bar 225. Vertical movement of sleeve 35 is guided by a press 237 mounted to upper slider sub-assembly 24, as illustrated.

Referring now to FIGS. 9 and 12, the lower push bar sub-assembly includes a lower push bar 238 formed with a pressing head 239 at its lower extremity. A flange 240 inserted in a groove formed along the inside surface of coupling 227 supports lower push bar 238 which has two stop plates 241 and 242 secured to the top thereof by a screw 243. Lower push bar 238 is supported slideably in block 49 by a bearing 244 so it may slide vertically in block 49. A concave depression 245 is formed in pressing head 239 so it may be brought into registration with electronic element 64 of electronic component 17 when held in holding and guiding sub-assembly 21. Lower push bar 238 rotates in cooperation with rotary sleeve 248, which rotation is released by coupling 227 and is not transmitted to upper push bar 225.

Referring now to FIGS. 7 and 8, the mechanism for displacing push bar sub-assembly 26 in the vertical direction will now be described. Sleeve cam 36 secured to upper slider sub-assembly 24 is formed with a lower vertical flat surface 246, an inclined surface 247, an upper flat surface 248 and upper inclined surfaces 249 and 250, respectively, from the lower end of sleeve cam 36. A roller 251 adapted to follow the surfaces of sleeve cam 36 is mounted on the upper arm of bell crank 254 pivotally supported by a pin 253 to a bearing 252 which is secured to frame 23. The lower arm of bell crank 254 is formed with a U-shaped groove 255 in which is engaged a pin 256 mounted on sleeve 35 so that sleeve 35 is displaced vertically in cooperation with movement of roller 251 along the surfaces of sleeve cam 36. When the elements are in the position shown in FIG. 8, roller 234 of clamp 38 is engaged with cam clamp 39 and the upper end of clamp 38 is disengaged from threaded portion 236 of upper push bar 225. Accordingly, movement of bell crank 254 is transmitted to coupling 227 by biasing action of spring 228. However, relative movement between upper slider sub-assembly 24 and sleeve 35 results only when cam clamp 39 which is attached to upper slider assembly 24 separates from roller 234. Clamp 38 abuts upper push bar 225 and movement of bell crank 254 is transmitted integrally to coupling 227 directly without biasing spring 228. As flange 240 which is integrated with coupling 227 is not attached to stop plate 241, upper push bar 225 and lower push bar 238 may move relative with respect to each other up to a distance corresponding to the clearance between the upper end of screw 243 and coupling 227. Movement of bell crank 254 is stopped by a limit switch before roller 251 arrives at the lowest point of travel along inclined surface 253. The exact position for stopping bell crank 254 is determined by the distance electronic component 17 is inserted into substrate 19.

The portion 236 of upper push bar 225 need not necessarily be provided with threads. If the surface of this portion is suitably selected such that an appropriate coefficient of friction between the end of the clamp 38 and the portion corresponding to the threaded portion 236 is obtained with respect to the clamping force exerted by the clamp 38, the electronic component is protected against any breakage which might be attributed to the overload caused by an excessive inserting motion as in the case of insertion of electronic component having a large height, since such an overload is conveniently absorbed by a sliding movement which takes place at the frictional portion.

As shown in FIG. 7, chuck cam 37 mounted on upper slider sub-assembly 24 is formed with a lower vertical surface 257, an lower inclined surface 258, an upper inclined surface 259 and an upper vertical surface 260, respectively, from the lower end and is positioned to permit movement thereon by a roller 261. Roller 261 is mounted rotatably on a lever 263 rotatably supported on frame 23 by a pin 262. When roller 261 travels on surface 258 of chuck cam 37, lever 263 pivots about pin 262 and is displaced in the counterclockwise direction causing a striker 264 mounted on the lower end of lever 263 to abut roller 73 of chuck 15 thereby opening movable claw 52 and fixed claw 67. This movement releases electronic component 17 from chuck 15 which is then displaced by rotation of rotary chuck holder 14.

Operation of the inserting machine having the improved insert assembly constructed and arranged in accordance with the invention will now be described. Referring to FIG. 7, electronic component 17 is shown gripped by movable claw 52 and fixed claw 67 of chuck 15 has been brought to a release position by movement of rotary disc 14. In response to a signal from the NC program, cylinder 27 is actuated to lower upper slider sub-assembly 24 at a constant speed. During this downward movement, the respective members perform the following functions by action of the various cams mounted on upper slider sub-assembly 24.

Initially, roller 251 travels on inclined surface 247 of sleeve cam 36 and sleeve 35 is lowered as bell crank 254 pivots about pin 253. The angle of inclined surface 247 is predetermined so that sleeve 35 travels at the same speed as upper slider sub-assembly 24. There is no relative movement between clamp cam 39 and roller 234 and clamp 38 remains in the position shown in FIG. 8 and no clamping of the upper push bar 225 occurs. As bell crank 254 pushes sleeve 35 downwardly, upper push bar 225 and stop plate 226 are lowered by the gripping action of sleeve 35 thereby lowering spring 228 together with sleeve 35. Lower push bar 238 which is suspended from flange 240 through stop plate 241 is lowered by gravity and the downward movement of upper push bar 225.

Lower slider sub-assembly 25 moves upwardly by action of roller 55, bell crank 54 and connection rod 56 as roller 55 engages convex surface 58 of lower slider cam 29. Outer holding members 266,266 and inner guiding member 267 move upwardly in response to movement of bell crank 54. Leads 53 of electronic component 17 are guided into guide grooves 292 and 301 and are held therein and gripped between holding grooves 302 and flat surfaces 303.

At the same time, sleeve 35 is displaced downwardly further and push head 239 of lower push bar 238 abuts the top of electronic element 64 of electronic component 17. As bell crank 254 is rotated to lower sleeve 35 lower push bar 238 is not lowered further as it abuts the top of electronic component 17. However, when coupling 227 is lowered until it abuts with screw 243, sleeve 35 pushes down on lower push bar 238 by action of spring 228. When sleeve 235 is lowered further, spring 228 compresses and a biasing force corresponding to this compression is imposed on the top of electronic component 17. As sleeve 35 is lowered further, roller 251 arrives at flat surface 248 and movement of sleeve 35 stops.

Upper slider sub-assembly 24 continues its downward movement thereby separating cam clamp 39 from roller 234 and clamp 38 clamps upper push bar 225 due to the biasing force of spring 235. Accordingly, movement of sleeve 35 is integrated with upper push bar 225 and spring 228 is maintained in a compressed state with the internal biasing force on electronic component 17 gripped between movable claw 52 and fixed claw 67 of chuck 15 and press head 239.

Even if the type of electronic component 17 to be inserted is altered and the insertion height is changed, the advantages of this type of insert assembly are clearly apparent. The position of vertical surface 248 of sleeve cam 36, which determines the stopping position of sleeve 35, need not be changed, even though a taller electronic component falls into contact with push head 239 at an earlier position. This causes spring 228 to yield to a larger extent and exert a larger biasing force. On the other hand, a spring 228 having a lower compression strength may be chosen. It is possible to select an appropriate spring force for any type of electronic component and thereby avoid damage to the component irrespective of the type of component to be inserted. The exact position of vertical surface 248 is selected so that when an electronic component having the shorter height is selected, the downward movement of sleeve 35 is stopped after slight yielding of spring 228.

Substantially simultaneous with the above downward movement of upper slider sub-assembly 24, lever 263 is displaced in the counterclockwise direction of travel of roller 261 along inclined surface 258 of chuck cam 37. As lever 263 is displaced, striker 264 abuts roller 73 thereby opening movable claw 52 and fixed claw 67. At the same time, the biasing force imposed on electronic component 17 by spring 228 is released which returns to its unbiased position. Chuck 15 is retracted back and electronic component 17 is delivered to the insert position gripped by outer and inner holding and guiding members 266, 266 and 267. Striker 264 returns to its original position by action of roller 261 travelling along inclined surface 259 of chuck cam 237. This immediate return is required so that there is clearance between striker 264 and roller 73 when rotary chuck holder 14 is rotated.

For rotating the lead holding and guiding sub-assembly 21 around the vertical axis, the cylinder 274 is energized to move the roller 277 to the position 277' closer to the slider 278. As a result, by the action of the rotary cam 269 or, if the rotary cam 269 has been put into operation, by the action of the cylinder 274, the roller 277' pushes the slider 278 to rotate the rotary sleeve 48 through the action of the rack 89 and cooperating pinion 91.

As sleeve 35 is lowered further, lower slider sub-assembly 25 is also lowered due to travel of roller 251 along upper inclined surface 249 of sleeve cam 36. As roller 216 travels along inclined surface 60 of lower slider cam 29, push head 239 and outer holding member 266, 266 and inner guiding member 267 are lowered while keeping the same distance therebetween and gripping electronic component 17 between the members 266, 266 and 267.

Just before the lower faces of the outer holding members 266, 266 and inner guiding member 267 fall in contact with printed circuit board 19, lower slider sub-assembly 25 abuts stopper 92 and its downward movement ceases. At this point, roller 55 has not reached vertical surface 61 of lower slider cam 29 and a certain clearance is maintained. When lower slider sub-assembly 25 abuts stopper 92 there is a natural tendency to spring up, however, it is prevented from doing so by grooves of lower slider cam 29.

As sleeve 35 is lowered further, electronic component 17 is pressed by push head 239 and slides between holding groove 302 and flat surface 303. As a result thereof, the ends of leads 53 are inserted into openings 19' of printed circuit board 19. As push head 239 continues to push on electronic component 17, leads 53 are pushed further down and they are bent into the configuration shown in FIG. 3 to form a stopper portion 265. At the point where stopper portion 265 abuts printed circuit board 19 and by action of a limit switch (not shown) the movement of bell crank 254 stops the downward movement of push head 239. Excess portions of leads 53 are cut and the bending of the cut and portions are performed from the back surface of printed circuit board 19 by the cutting and bending mechanism (not shown). Leads 53 of electronic component 17 are now secured to printed circuit board 19 as illustrated in FIG. 4.

Figure 19:
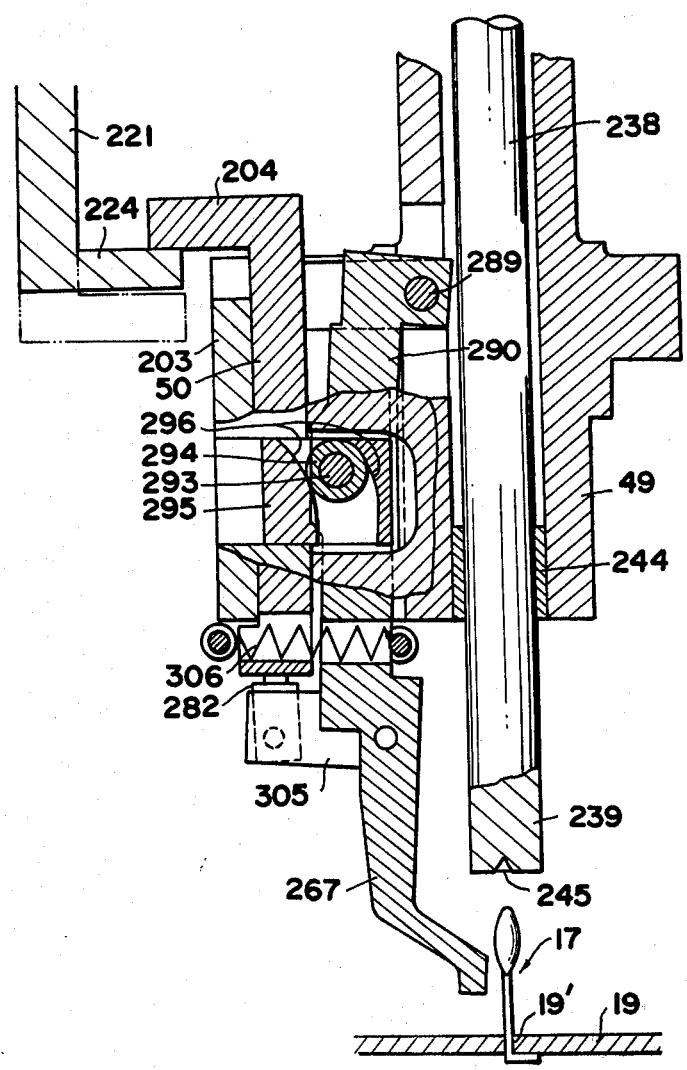
FIG. 19 is a sectional view showing the operation of an operating rod of the assembly and comprises a sectional side elevational view taken along the line II—II of FIG. 13, with the portion around a cam groove shown in section taken along the line I—I of FIG. 13.

When leads 53 are inserted into openings 19' of printed circuit board 19, roller 216 travels along inclined surface 217 of opening and closing cam 34 causing striker 221 to move upwardly. As shown in FIG. 19, lever portion 204 of operation rod 50 is lifted up by lower striker 224 of striker 221.

At the initial stage of the lifting stroke of the operation rod 50, the main guide 290 is lifted simultaneously by means of the pin 289. However, the main guide 290 is not tilted because the roller 294 is still in the vertical linear portion of the cam groove 296, so that the guiding member 267 and the holding members 266 move vertically upwardly. At the same time, as will be understood from FIG. 15, the cam head 283 of the cam lever 282 abuts the tapered cam surface 284 so that the pressing bolt 285 presses the lever 305. In consequence, the holding members 266 are moved as denoted by 266' (FIG. 16) to release the leads 53.

A further lifting of the operation rod 50 causes the main guide 290 to be lifted. Then, as the roller 294 moves into the curved portion of the cam groove 296, the main guide 290 starts to decline and the ends of the holding members 266' and the guiding member 267 start to move back. In this state, the holding members 266' and the guiding member 267 can be withdrawn without any interference with the electronic components 17, because the holding members are in the opened state.

FIG. 19 shows the operation rod 50 in the highest position in its stroke. Thereafter, the lead holding and guiding sub-assembly 21 as a whole starts to rise.

As to the interference with the already-mounted electronic components, referring to FIG. 16, neither the guiding member 267 nor the holding members 266, 266' interfere with the electronic components 17a arrayed in y-direction, so that the electronic components 17a can be arrayed at the minimum pitch which is required solely for reasons arising from the electronic component itself. As to the electronic components 17b arrayed in y-direction, it is necessary to preserve a clearance $b'$ between these components 17b and the holding members 266' in the opened state. The clearance $b'$, however, can be made sufficiently small, because the opening stroke of the holding members 266 is extremely small. It will be clear to those skilled in the art that a stroke which is as small as the diameter of the lead 53 is enough for releasing the leads 53.

It is, therefore, possible to mount the electronic components densely and, hence, to reduce the size of the product as a whole.

Therefore, by utilizing an improved insert assembly constructed and arranged in accordance with the invention, not only flat electronic components such as ceramic condensers, but also cylindrical and prismatic electronic elements can be inserted by the automatic inserting machine of the invention. Thus, various electronic components such as chemical condensers, Mylar condensers, peaking coils and resistors can be inserted conveniently and automatically into printed circuit board substrates.

Figure 1:
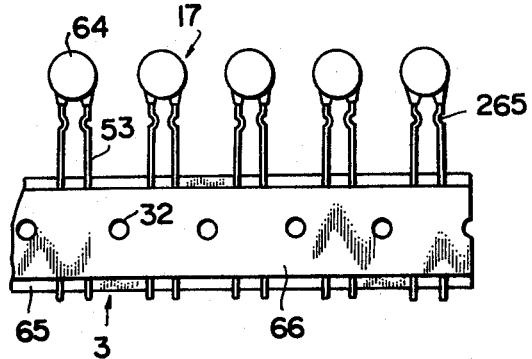
FIG. 1 is a plan view of a typical electronic component web carrier and associated components.
Figure 2:
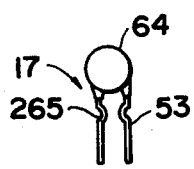
FIG. 2 illustrates an electronic component in the condition just prior to insertion in a printed circuit board.
Figure 3:
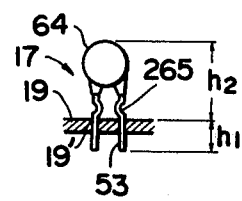
FIG. 3 illustrates an electronic component in the condition subsequent to insertion.
Figure 4:
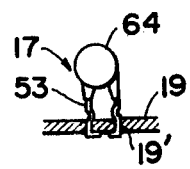
FIG. 4 illustrates an electronic component in the condition subsequent to being fixed to a printed circuit board.

Referring now to FIG. 3, if the height $h_1$ from the end of lead 53 to the lower end of stopper portion 265 is maintained constant, the stroke required to insert lead 53 into substrate 19 is not altered. Accordingly, when various electronic components differing in height $h_2$ from the lower end of stopper portion 265 to the top of element 64 are inserted, only a small biasing force imposed by soft spring 228 is changed, and the insertion operation is not influenced by the force of spring 228 and electronic components differing in height $h_2$ may be inserted by the same force. Furthermore, since insertion of lead 53 is stopped by limit switch at the point where the lower end of stopper 265 abuts printed circuit board 19, no greater force is imposed on electronic component 17 and it is prevented from being damaged. Moreover, when various electronic components differing in size are inserted, adjustments need not be made for the respective electronic components inserted. Therefore, automatic insertion of various types of electronic components can be accomplished easily.

Further, according to the invention, the size of the lead holding and guiding assembly itself, as well as the opening stroke of the same, is reduced to avoid interference with the already-mounted electronic components to permit insertion at a higher density thereby to reduce the size of the product such as a printed circuit board. At the same time, the inserting apparatus of the invention finds widespread use because it can handle a larger variety of electronic components. In addition, the construction of the lead holding and guiding assembly is simplified because it incorporates only one guiding member. Thus, the invention provides a highly efficient and reliable inserting apparatus which affords and easier automation of the insertion work. It will be clear to those skilled in the art that the inserting assembly of the invention contributes greatly to the improvements in both of practical use and production.

Obviously, numerous modifications and variations of the present invention are possible in the light of the above teachings. Therefore, it is understood that the invention can be varied within the scope of the claims appended hereto.

What is claimed is:

1. In apparatus for automatically inserting parallel lead electronic components into lead receiving openings in a printed circuit board, and wherein x, y and z directions are defined in a manner such that in an imaginary plane which intersects the leads and which is orthogonal thereto, the x direction is defined by the direction of a line extending between the points of intersection of the plane and the leads, the y direction is the direction in the plane which is perpendicular to the x direction, and the z direction is the direction perpendicular to the plane, the improvement comprising:

a frame;

lead holding and guiding means associated with said frame for holding and guiding the electronic components, said lead holding and guiding means including a guiding member having two side surfaces and an end portion mounted for rotation about an axis of rotation extending in the x-direction and for longitudinal movement extending in the z-direction, and a pair of holding members each having respective inner surfaces disposed at a respective one of said guiding member side surfaces, such that said side surfaces of said end portion of said guiding member and the respective inner side surfaces of said holding members constitute lead holding and guiding portions; and wherein each of said side surfaces of said guiding member has a groove formed therein extending substantially parallel to a line in a plane defined by the y-z directions, each of said holding members has a protrusion formed thereon extending substantially parallel to a line in a plane defined by the y-z directions, and wherein each of said protrusions are relatively loosely received in a corresponding one of said grooves whereby said holding members are mounted for a limited rotation relative to said guiding member about respective axes of rotation which extend parallel to a line in a plane defined by the y-z directions; whereby said lead holding and guiding portions can be opened and closed as said holding members are rotated.

2. The combination of claim 1 wherein each of said grooves formed in respective side surfaces of said guiding member constitutes a substantially vertically extending groove and each of said protrusions formed on respective holding members constitutes a substantially vertically extending protrusion.

3. The combination of claim 2 wherein each holding member is attached to said guiding member by a pin and wherein the holding members are normally urged against said guiding member by means of a spring to clamp the guiding member therebetween.

* * * * *